United States Patent [19]

Soda

[11] Patent Number: 5,355,094
[45] Date of Patent: Oct. 11, 1994

[54] FEEDBACK DIFFERENTIAL AMPLIFIER CIRCUIT

[75] Inventor: Masaaki Soda, Tokyo, Japan

[73] Assignee: NEC Corporation, Japan

[21] Appl. No.: 51,072

[22] Filed: Apr. 21, 1993

[30] Foreign Application Priority Data

Apr. 22, 1992 [JP] Japan .................................. 4-129665

[51] Int. Cl.$^5$ ............................................... H03F 3/45
[52] U.S. Cl. ..................................... 330/260; 307/494
[58] Field of Search ............... 330/252, 254, 260, 292, 330/305; 307/493, 494

[56] References Cited

U.S. PATENT DOCUMENTS 5,182,477  1/1993  Yamasaki et al. ............... 330/260 X

OTHER PUBLICATIONS

J. Lightwave Technology, vol. 8, No. 9, Sep. 1990 pp. 1371–1378.

Primary Examiner—Steven Mottola
Attorney, Agent, or Firm—Ostrolenk, Faber, Gerb & Soffen

[57] ABSTRACT

A feedback differential amplifying circuit comprising three-terminal type amplifying elements, each having an input terminal and two output terminals, wherein a variable capacitance circuit enabling variation of capacitance of a peaking circuit to obtain optimum peaking is provided. In the variable capacitance circuit, the capacitance of the peaking circuit is controlled by the junction capacitance of a three-terminal type amplifying element.

9 Claims, 5 Drawing Sheets

FEEDBACK DIFFERENTIAL AMPLIFIER CIRCUIT

BACKGROUND OF THE INVENTION

The present invention relates to a feedback differential amplifier circuit suitable for monolithic integration and enabling the variation of the frequency characteristic by controlling capacitance in a peaking circuit.

FIG. 5 illustrates a differential amplifying circuit using a conventional peaking circuit. In the figure, 1a is an input terminal receiving an input signal Vin, 1b is an input terminal receiving a reversed input signal [Vin], 2a is an output terminal outputting an output signal Vout, 2b is an output terminal outputting a reversed output signal [Vout], 3a and 3b are differential coupled transistors, 4a and 4b are load resistors, 5a and 5b are feedback resistors, 6 is a capacitor, 7 is a source of current, 8 is a power terminal at a lower electric potential and 9 is a power terminal at a higher electric potential.

As shown in articles (e.g. Hans M. Rein, "Silicon Bipolar Integrated Circuits for Multigigabit-per-second Lightwave Communications", JOURNAL OF LIGHTWAVE TECHNOLOGY, VOL.8, No.9, SEPTEMBER 1990, pp.1371–1378), such a differential amplifying circuit using a peaking circuit as shown in FIG. 5 is known conventionally. In such a circuit, it is intended to realize wide-band operation by supplying a feedback signal to the differential coupled transistors 3a and 3b through the feedback resistors 5a and 5b, and additionally even more wide-band operation by using the capacitor 6.

In such a circuit configuration, however, the peaking effect on the differential amplifying circuit is determined by a product (Re×Ce) of time constants of the feedback resistors and the capacitor and the internal time constant of the differential coupled transistors. Re is the value of the feedback resistors 5a and 5b, and Ce is the value of the capacitor 6.

Consequently, when designing a circuit by simulation and so on, optimization is performed by setting up internal parameters of transistors, etc. In this case, however, there is a defect in that discrepancy of optimized values caused by dispersion of elements may occur when the circuit is realized in a monolithic integration, with the result that the optimum frequency characteristic cannot be obtained.

SUMMARY OF THE INVENTION

An object of the present invention, in view of the above problems, is to provide a differential amplifying circuit enabling the control of the capacitance of the peaking circuit to achieve optimum peaking.

The above object is achieved by a feedback differential amplifier circuit comprising a differential amplifier circuit and a peaking circuit, the differential amplifier circuit comprising three-terminal type amplifying elements each having an input terminal and two output terminals, the output terminals defining output sides of the amplifying elements, and wherein the capacitance of the peaking circuit is variable.

Moreover, it is desirable that the differential amplifier circuit comprises a first amplifying element and a second amplifying element, which together comprise a differential pair, and a first resistive element and a second resistive element, wherein one of the output terminals of the first amplifying element is adapted to be coupled to a first electric potential through said first resistive element, one of the output terminals of said second amplifying element is adapted to be coupled to said first electric potential through said second resistive element, the other output terminal of said first amplifying element adapted to be coupled to an input of a variable capacitance circuit and a feedback circuit, the other output terminal of said second amplifying element adapted to be coupled to another input of the variable capacitance circuit and the feedback circuit.

Moreover, in order that the peaking circuit have a variable capacitance circuit and a feedback circuit, the variable capacitance circuit controls the capacitance of the peaking circuit by the junction capacitance of the three-terminal type amplifying element.

Such a variable capacitance circuit can comprise a variable capacitance circuit having a third amplifying element and a fourth amplifying element comprising a differential pair, wherein one of the output terminals of the third amplifying element, one of the output terminals of the fourth amplifying element and a variable source of current are coupled to each other and the variable source of current is coupled to a terminal at a second lower electric potential, another output terminal of the third amplifying element is coupled to one of the output sides of an amplifying element of the differential pair in the differential amplifier circuit through said third resistive element, another output terminal of the fourth amplifying element is coupled to one of the output sides of an amplifying element of the differential pair in the differential amplifier circuit through the fourth resistive element, the respective input terminals of the third amplifying element and the fourth amplifying element being coupled to the other output sides of the respective amplifying elements of the differential pair in the differential amplifier circuit.

The variable capacitance circuit can comprise a variable capacitance circuit having the third amplifying element and the fourth amplifying element comprising a differential pair, wherein one of the output terminals of the third amplifying element, one of the output terminals of the fourth amplifying element and the variable source of current are connected together, and the variable source of current is connected to the lower electric potential, another output terminal of the third amplifying element is connected to one of the output sides of an amplifying element of the differential pair in the differential amplifier circuit through the third resistive element, another output terminal of the fourth amplifying element is connected to one of the output sides of an amplifying element of the differential pair in the differential amplifier circuit through the fourth resistive element, the respective input terminals of the third amplifying element and the fourth amplifying element are connected to another output side of an amplifying element of the differential pair in the differential amplifier circuit, capacitors are connected between the respective input terminals of the third amplifying element and the fourth amplifying element and output terminals of the third and fourth amplifying elements, respectively.

Also, the variable capacitance circuit can comprise a variable capacitance circuit having the third amplifying element and the fourth amplifying element comprising a differential pair, a fifth amplifying element and a sixth amplifying element, wherein one of the output terminals of the third amplifying element, one of the output terminals of the fourth amplifying element and the source of current are connected to each other, and the source of current is connected to the second, lower electric potential, the other output terminal of the third amplifying element is connected to one of the output sides of an amplifying element comprising the differential pair in the differential amplifying circuit through the output side of the fifth amplifying element, the other output terminal of the fourth amplifying element is connected to one of the output sides of an amplifying element of the differential pair in the differential amplifying circuit through the sixth amplifying element, each input terminal of the third amplifying element and fourth amplifying element is connected to respective ones of the other output sides of the amplifying elements of the differential pair in the differential amplifying circuit, each input terminal of the fifth amplifying element and the sixth amplifying element is connected to a common variable electric power source.

Furthermore, the variable capacitance circuit can comprise a variable capacitance circuit having a third amplifying element and a fourth amplifying element, a fifth amplifying element and a sixth amplifying element, wherein one of the output terminals of the third amplifying element is connected to one of the output terminals of the fifth amplifying element and one of the output terminals of the fourth amplifying element is connected to one of the output terminals of the sixth amplifying element, the other output terminal of the third amplifying element is connected to one of the output sides of the amplifying elements comprising the differential pair in the differential amplifying circuit through the third resistive element, the other output terminal of the fourth amplifying element is connected to one of the output sides of the amplifying elements comprising the differential pair in the differential amplifying circuit through the fourth resistive element, the other output terminal of the fifth amplifying element, the other output terminal of the sixth amplifying element and the source of current are connected to each other, and the source of current is connected to the second lower electric potential, each input terminal of the third amplifying element and the fourth amplifying element is connected to the other output sides of the amplifying elements comprising the differential pair in the differential amplifying circuit, each input terminal of the fifth amplifying element and the sixth amplifying element is connected to a common variable electric power source.

Additionally, the above feedback circuit can comprise a feedback circuit having a fifth resistive element and a sixth resistive element, wherein an end of the fifth resistive element and an end of the sixth resistive element are connected to each other, and additionally connected to the second lower electric potential through the source of current, the other end of the fifth resistive element is connected to one of the output sides of the differential elements comprising the differential pair in the differential amplifying circuit, the other end of the sixth resistive element is connected to the other output side of the amplifying elements comprising the differential pair in the differential amplifying circuit.

BRIEF DESCRIPTION OF THE DRAWING(S)

DETAILED DESCRIPTION OF THE INVENTION

Figure 1:
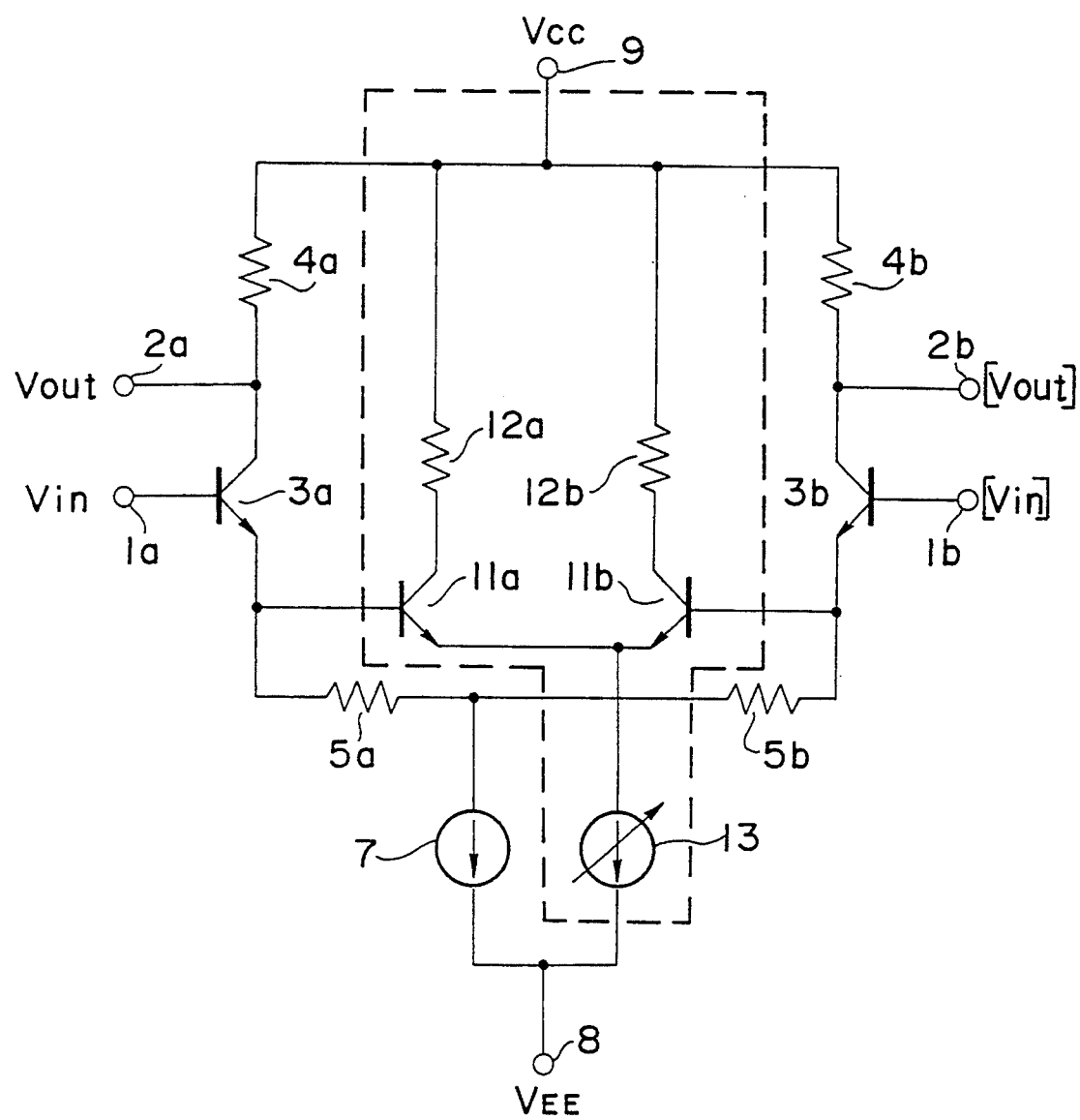
FIG. 1 is a circuit diagram illustrating a first embodiment of the present invention.

FIG. 1 is a circuit diagram illustrating a first embodiment of the present invention.

In FIG. 1, $1a$ is an input terminal receiving an input terminal Vin, $1b$ is an input terminal receiving a reversed input signal [Vin], $2a$ is an output terminal providing an output signal Vout, $2b$ is an output terminal outputting a reversed output signal [Vout], $3a$ and $3b$ are differential coupled transistors in the differential amplifying circuit, $4a$ and $4b$ are load resistors, $5a$ and $5b$ are feedback resistors, 7 is a source of current, 8 is a terminal supplied with an electric potential Vee from a lower electric potential power source, and 9 is a terminal supplied with an electric potential Vcc from a higher electric potential power source. Differential coupled transistors $11a$ and $11b$, resistors $12a$ and $12b$ and the variable source of current 13 comprise a variable capacitance circuit.

The peaking characteristic is determined by the base side capacitance of the transistors used in the variable capacitance circuit and the time constant of the feedback resistors. The base side capacitance of the transistors can be expressed by the sum of the base-to-emitter capacitance and the Miller capacitance. The Miller capacitance is determined by the mutual conductance, the base-to-collector capacitance and the collector side resistance of the transistors in the variable capacitance circuit. Therefore, if the collector current is varied, the mutual conductance is varied and the Miller capacitance is also varied, and thus the peaking characteristic can be varied.

The embodiment of FIG. 1 will now be explained in detail. The capacitance of the variable capacitance circuit is the capacitance Ce from the base side of the transistor $11a$ in the variable capacitance circuit. Additionally considering the Miller capacitance, the Ce is expressed by the following equation.

$$Ce = Cbe + (1 + gm \times Rc) \times Cbc \qquad (1)$$

Where Cbe is the base-to-emitter capacitance and Cbc is the base-to-collector capacitance of the transistor $11a$, gm is the mutual conductance of the transistor $11a$ and Rc is the resistance value of the resistor $12a$.

The mutual conductance gm is varied by the collector current Ic in the transistor $11a$ and can be expressed as below, using the charge q, Boltzmann constant k and absolute temperature T.

$$gm = (q/kT) \times Ic \qquad (2)$$

By varying the current value of the variable source of current 13, Ic varies, and Ce varies as determined by equations (1) and (2).

Practically, using transistors having ft=40 GHz, the circuit was produced experimentally. A circuit was produced with a value of load resistors $4a$ and $4b$ of 150Ω, a value of feedback resistors $5a$ and $5b$ of 40Ω, transistors were used for the constant source of current 7 and variable source of current 13, and the value of current was used by the value designed by simulation. With these components, the gain between Vin and Vout was measured with the result that a bandwidth of 6 Ghz at gain 8 db was obtained. By controlling the current value of the transistor of the variable source of current, the Miller capacitance varied and the bandwidth could be varied from 6 GHz to 8 GHz.

Figure 2:
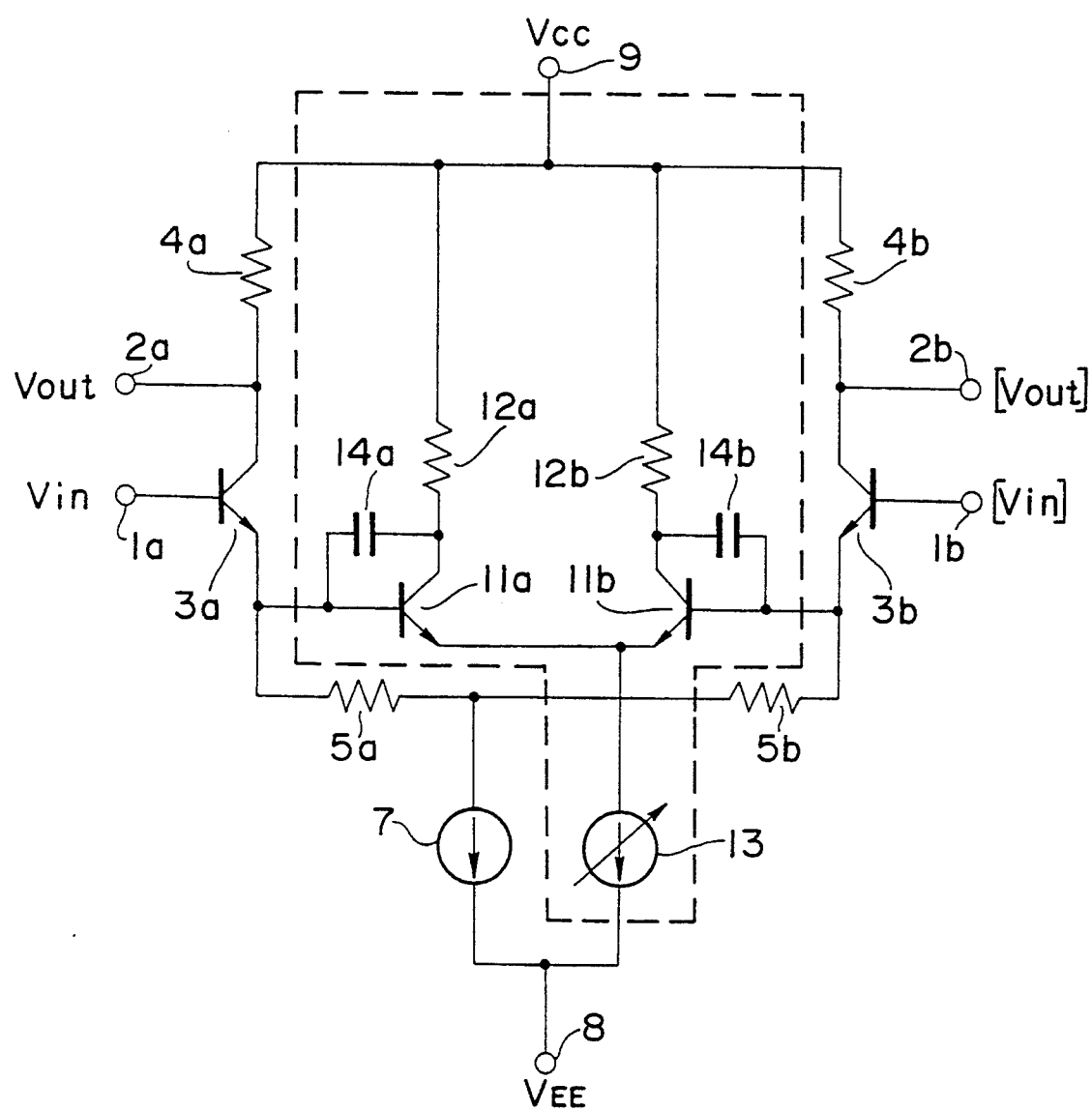
FIG. 2 is a circuit diagram illustrating a second embodiment of the present invention.

FIG. 2 is a circuit diagram showing a second embodiment of the present invention.

In this circuit, the respective capacitors 14a and 14b are added between the base and collector of respective transistors 11a and 11b in the variable capacitance circuit of FIG. 1. Letting each capacitance thereof be Cb, the value of Ce can be obtained by replacing Cbc with Cbc+Cb in equation (1). Thus, the circuit provides a larger Ce, so that it is effective when a large capacitance that is difficult to be realized in a monolithic circuit is needed.

Moreover, this circuit was produced experimentally using the same transistors as those used in FIG. 1. A circuit was produced with a value of load resistors 4a and 4b of 200Ω, a value of load resistors 12a and 12b in the variable capacitance circuit of 240Ω, a value of feedback resistors 5a and 5b of 15Ω, and transistors were used for the variable source of current 13. Without the capacitors 14a and 14b, the bandwidth could not be extended to 4 GHz even controlling the variable source of current 13. However, with capacitors 14a and 14b of 0.05 pF, the peaking controlling width was extended and the bandwidth was extended to 5 GHz.

Figure 3:
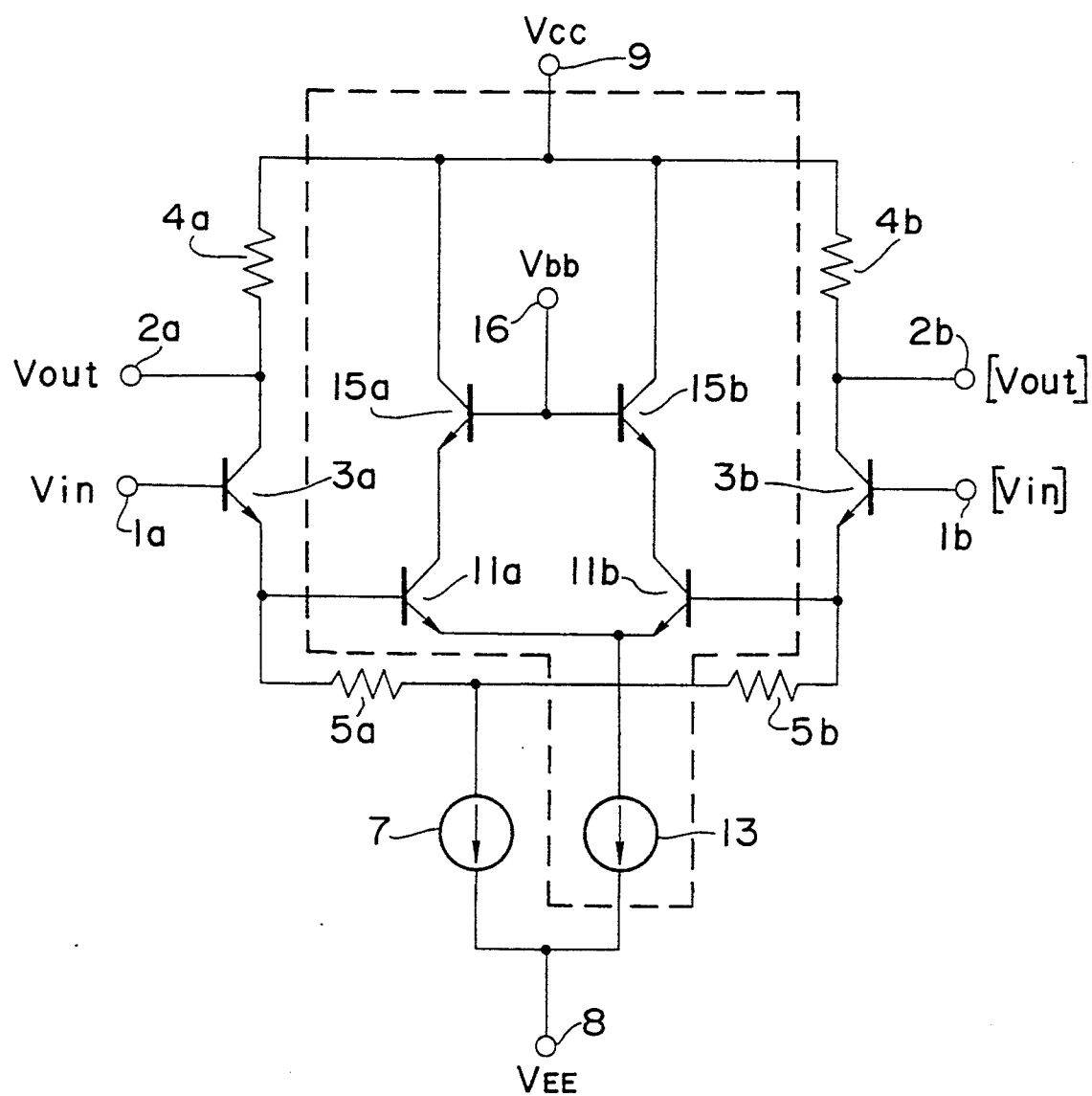
FIG. 3 is a circuit diagram illustrating a third embodiment of the present invention.

FIG. 3 is a circuit diagram showing a third embodiment of the present invention.

In this circuit, the load resistors 12a and 12b in the variable capacitance circuit of FIG. 1 are replaced with the transistors 15a and 15b. By varying the base electric potential thereof, the capacitance can be varied in this circuit. In this circuit, as the collector-to-emitter alternating resistance varies at the operating point of transistors 15a and 15b, the capacitance Ce varies. It is thus the same as varying Rc in equation (1).

This circuit was also produced experimentally using the same transistors as those used in FIG. 1 with a value of load resistors 4a and 4b of 150Ω, a value of feedback resistors 5a and 5b of 40Ω. The current value of the source of current 13 was not varied and the electric potential of the terminal 16 was varied. By varying the electric potential of the terminal 16, the peaking effect varied and a flat frequency characteristic in a band of 5.5 GHz and gain of 8 db was obtained.

Figure 4:
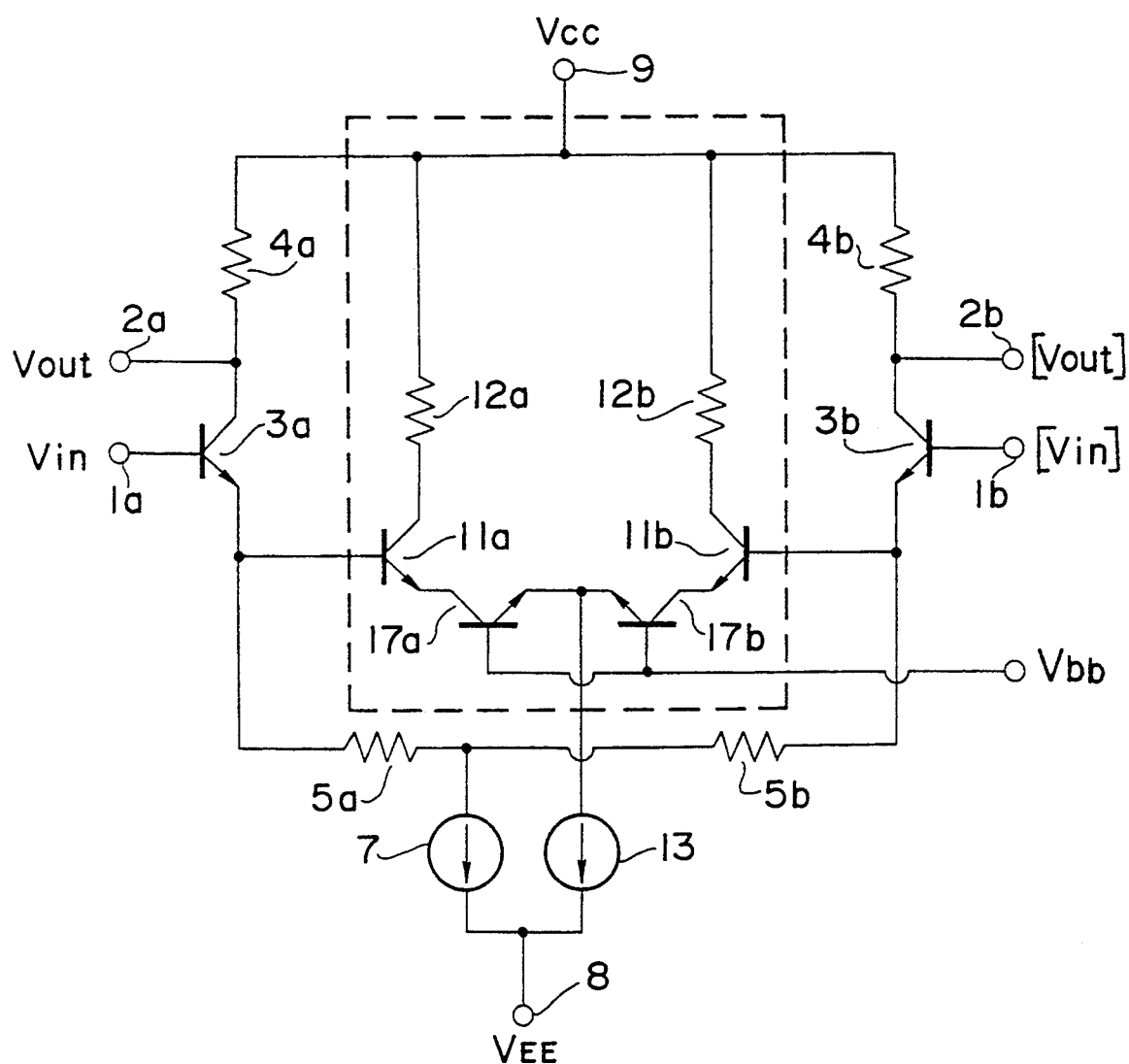
FIG. 4 is a circuit diagram illustrating a fourth embodiment of the present invention.
Figure 5:
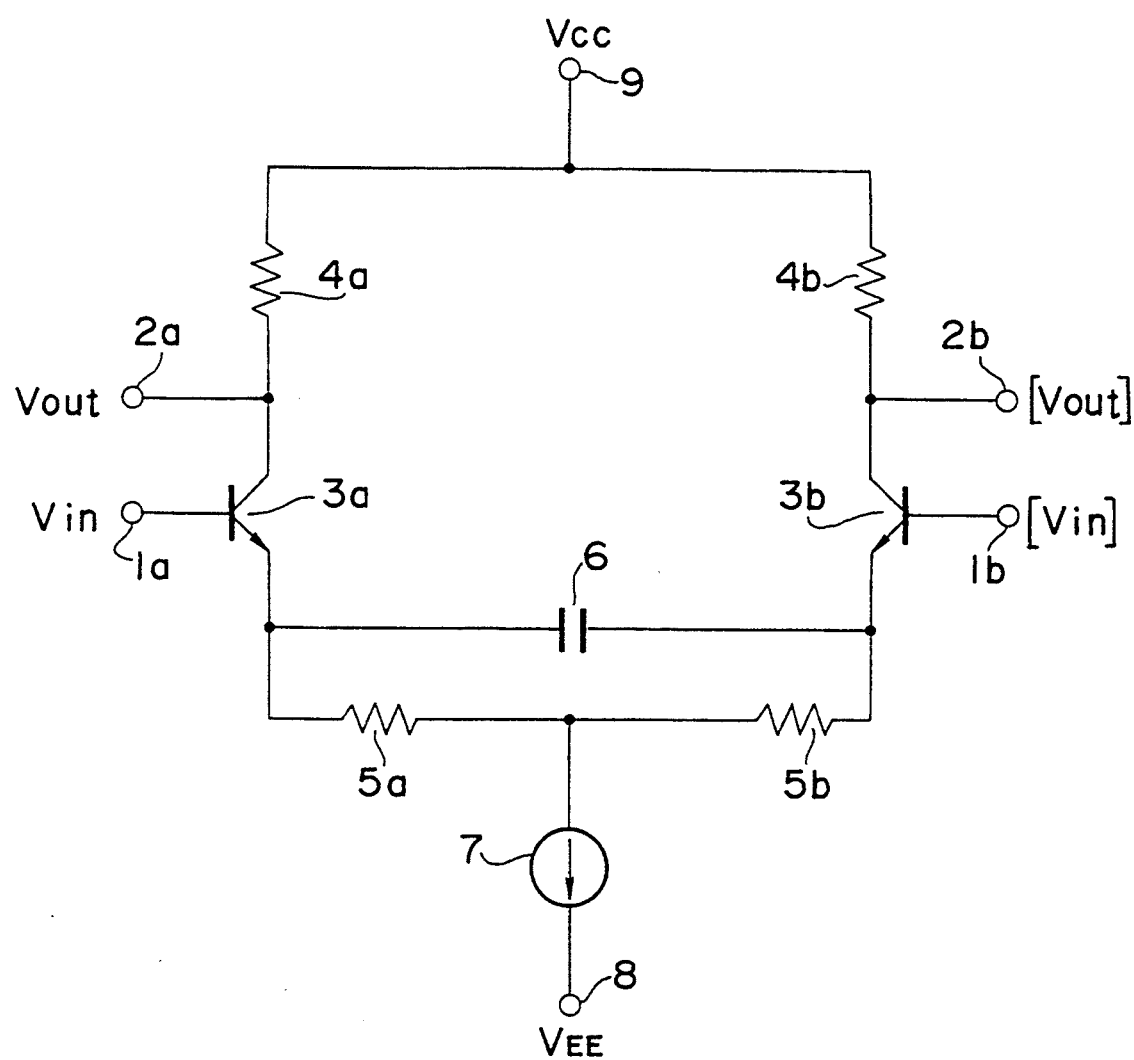
FIG. 5 is a circuit diagram illustrating a differential amplifying circuit using a conventional peaking circuit.

FIG. 4 is a circuit diagram showing a fourth embodiment of the present invention.

In this circuit, transistors 17a and 17b were connected to the emitter side of transistors 11a and 11b FIG. 1. By varying the base electric potential thereof, the capacitance can be varied. In this circuit, as the collector-to-emitter alternating resistance varies at the operating point of transistors 17a and 17b and the transistors 11a and 11b are provided with negative feedback by the resistance, the capacitance Ce varies similarly as the value of gm varies in equation (1).

This circuit was also produced experimentally using the same transistors as those used in FIG. 1 with a value of load resistors 4a and 4b of 200Ω, and a value of feedback resistors 5a and 5b of 50Ω. In this circuit, by varying the electric potential of the terminal 18, the peaking effect varied. At the beginning of the variation, approximately 10 db peaking occurred, then a flat characteristic was obtained, and a bandwidth of 5 GHz was obtained.

In the above circuits, NPN bipolar transistors were used for the amplifying elements. However, it is possible to replace them with any three-terminal type amplifying element such a PNP bipolar transistor or FET. Also, it is possible to apply active loads using an amplifying element instead of the feedback resistors in the amplifying circuit.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A feedback differential amplifier circuit having a differential amplifier and a peaking circuit, wherein:
   said peaking circuit comprises a capacitance circuit having a variable capacitance and a feedback circuit;
   said differential amplifier comprises first and second three-terminal type amplifying elements and first and second resistive elements, each of the first and second amplifying elements having two output terminals and an input terminal;
   one of the output terminals of said first amplifying element being adapted to be coupled to a first electric potential through said first resistive element, and one of the output terminals of said second amplifying element being adapted to be coupled to said first electric potential through said second resistive element;
   the other output terminal of said first amplifying element being adapted to be coupled to an input of said variable capacitance circuit and an input of said feedback circuit; and
   the other output terminal of said second amplifying element being adapted to be coupled to an input of said variable capacitance circuit and an input of said feedback circuit.

2. A feedback differential amplifier circuit having a differential amplifier comprising first and second three-terminal type amplifying elements, each having an input terminal and two output terminals and further comprising a peaking circuit comprising a capacitance circuit having a variable capacitance and a feedback circuit, one of the output terminals of each of the first and second amplifying elements being adapted to be coupled to a first source of electric potential through respective first and second resistive elements, and further wherein:
   said variable capacitance circuit comprises third and fourth three-terminal type amplifying elements, each having an input and two output terminals;
   one of the output terminals of said third amplifying element and one of the output terminals of said fourth amplifying element being coupled to each other and being coupled to a variable electric power source, said variable electric power source being adapted to be coupled to a second electric potential less than said first electric potential;
   another output terminal of said third amplifying element being coupled to one of the output terminals of said first amplifying element through a third resistive element, another output terminal of said fourth amplifying element being coupled to one of said output terminals of said second amplifying element through a fourth resistive element;

said input terminals of said third and said fourth amplifying elements being coupled to said feedback circuit; and the capacitance of said peaking circuit being adjustable by a junction capacitance of at least one of said three-terminal type amplifying elements in said variable capacitance circuit.

3. A feedback differential amplifier circuit having a differential amplifier comprising first and second three-terminal type amplifying elements, each having an input terminal and two output terminals and further comprising a peaking circuit comprising a capacitance circuit having a variable capacitance and a feedback circuit, one of the output terminals of each of the first and second amplifying elements being adapted to be coupled to a first source of electric potential through respective first and second resistive elements, and further wherein:

said variable capacitance circuit comprises third and fourth three-terminal type amplifying elements, each having an input and two output terminals;

one of the output terminals of said third amplifying element and one of the output terminals of said fourth amplifying element being coupled to each other and being coupled to a variable electric power source, said variable electric power source being coupled to a second electric potential less than the first electric potential;

another output terminal of said third amplifying element being coupled to one of the output terminals of said first amplifying element through a third resistive element, another output terminal of said fourth amplifying element being coupled to one of said output terminals of said second amplifying element through a fourth resistive element;

said input terminals of said third and said fourth amplifying elements being coupled to said feedback circuit;

capacitances provided between respective input terminals of said third and fourth amplifying elements and respective ones of said third and fourth resistance elements; and the capacitance of said peaking circuit being adjustable by a junction capacitance of at least one of said three-terminal type amplifying elements in said variable capacitance circuit.

4. A feedback differential amplifier circuit having a differential amplifier comprising first and second three-terminal type amplifying elements, each having an input terminal and two output terminals and further comprising a peaking circuit comprising a capacitance circuit having a variable capacitance and a feedback circuit, one of the output terminals of each of the first and second amplifying elements being adapted to be coupled to a first source of electric potential through respective first and second resistive elements, and further wherein:

the variable capacitance circuit comprises third, fourth, fifth and sixth three-terminal type amplifying elements, each having an input and two output terminals;

one of the output terminals of said third amplifying element and one of the output terminals of said fourth amplifying element being coupled to each other and being coupled to an electric power source, said electric power source being coupled to a second electric potential less than the first electric potential;

another output terminal of said third amplifying element being coupled to one of the output terminals of said first amplifying element through an output circuit of said fifth amplifying element, another output terminal of said fourth amplifying element being coupled to one of the output terminals of said second amplifying element through an output circuit of said sixth amplifying element;

the input terminals of said third and fourth amplifying elements being coupled to said feedback circuit;

the input terminals of said fifth and sixth amplifying elements being coupled to a common electric power source; and the capacitance of said peaking circuit being adjustable by a junction capacitance of at least one of said three-terminal type amplifying elements in said variable capacitance circuit.

5. A feedback differential amplifier circuit having a differential amplifier comprising first and second three-terminal type amplifying elements, each having an input terminal and two output terminals and further comprising a peaking circuit comprising a capacitance circuit having a variable capacitance and a feedback circuit, one of the output terminals of each of the first and second amplifying elements being adapted to be coupled to a first source of electric potential through respective first and second resistive elements, and further wherein:

said variable capacitance circuit comprises third, fourth, fifth and sixth three-terminal type amplifying elements, each having an input and two output terminals;

one of the output terminals of said third amplifying element being coupled to one of the output terminals of said fifth amplifying element, and one of the output terminals of said fourth amplifying element being coupled to one of the output terminals of said sixth amplifying element;

another output terminal of said third amplifying element being coupled to one of the output terminals of said first amplifying element through a third resistive element, and another output terminal of said fourth amplifying element being coupled to one of the output terminals of said second amplifying element through a fourth resistive element;

another output terminal of said fifth amplifying element and another output terminal of said sixth amplifying element being coupled to each other, and further being coupled to an electric power source, said electric power source adapted to be coupled to a second electric potential less than said first electric potential, the input terminals of said third and fourth amplifying element being coupled to said feedback circuit;

the input terminals of said fifth and sixth amplifying element being coupled to a common variable electric power source; and the capacitance of said peaking circuit being adjustable by a junction capacitance of at least one of the three-terminal type amplifying elements in said variable capacity circuit.

6. The feedback differential amplifier circuit of claim 2, further comprising fifth and sixth resistive elements in said feedback circuit, wherein;

an end of said fifth resistive element and an end of said sixth resistive element are coupled to each other, and are adapted to be coupled to said second electric potential through said electric power source; and another end of said fifth resistive element is coupled to one of the output terminals of said first amplifying element, and another end of said sixth resistive element is coupled to one of the output terminals of said second amplifying element.

7. The feedback differential amplifier circuit of claim 3, further comprising fifth and sixth resistive elements in said feedback circuit, wherein;

an end of said fifth resistive element and an end of said sixth resistive element are coupled to each other, and are adapted to be coupled to said second electric potential through said electric power source; and another end of said fifth resistive element is coupled to one of the output terminals of said first amplifying element, and another end of said sixth resistive element is coupled to one of the output terminals of said second amplifying element.

8. The feedback differential amplifier circuit of claim 4, further comprising fifth and sixth resistive elements in said feedback circuit, wherein;

an end of said fifth resistive element and an end of said sixth resistive element are coupled to each other, and are adapted to be coupled to said second electric potential through said electric power source; and another end of said fifth resistive element is coupled to one of the output terminals of said first amplifying element, and another end of said sixth resistive element is coupled to one of the output terminals of said second amplifying element.

9. The feedback differential amplifier circuit of claim 5, further comprising fifth and sixth resistive elements in said feedback circuit, wherein;

an end of said fifth resistive element and an end of said sixth resistive element are coupled to each other, and are adapted to be coupled to said second electric potential through said electric power source; and another end of said fifth resistive element is coupled to one of the output terminals of said first amplifying element, and another end of said sixth resistive element is coupled to one of the output terminals of said second amplifying element.

* * * * *